United States Patent [19]

Sugimoto

[11] Patent Number: 4,833,511
[45] Date of Patent: May 23, 1989

[54] PHOTOTRANSISTOR DEVICE

[75] Inventor: Mitsunori Sugimoto, Tokyo, Japan

[73] Assignee: NEC Corporation, Tokyo, Japan

[21] Appl. No.: 15,464

[22] Filed: Feb. 17, 1987

[30] Foreign Application Priority Data

Feb. 17, 1986 [JP] Japan .................................. 61-33287

[51] Int. Cl.$^4$ ..................... H01L 31/12; H01L 27/12;
H01S 3/19; G02B 5/23
[52] U.S. Cl. .......................................... 357/19; 357/4;
357/16; 357/30; 357/17; 372/50; 350/354
[58] Field of Search ............... 357/19, 4 SL, 16, 30 E,
357/30 L, 30 P, 17; 372/50; 350/354

[56] References Cited

U.S. PATENT DOCUMENTS 4,525,687  6/1985  Chemla et al. .......................... 357/16
4,716,449 12/1987  Miller ..................................... 357/58

OTHER PUBLICATIONS

Sze, S. M., "Phototransistor" In:*Physics of Semiconductor Device* (N.Y., Wiley, 1981) pp. 783-787.
Miller et al., "Novel Hybrid Optically Bistable Switch . . ." Appl. Phys. Lett 45 (1), Jul. 1, 1984, pp. 13-15.

Primary Examiner—Andrew J. James
Assistant Examiner—Robert P. Limanek
Attorney, Agent, or Firm—Sughrue, Mion, Zinn, Macpeak & Seas

[57] ABSTRACT

An improved phototransistor device comprises a collector region and a base region respectively provided on the opposite sides of a multiple quantum well, and an emitter region provided on one side of the base region. A reverse-biased voltage is applied across the multiple quantum well while incident light is input to be absorbed in the multiple quantum well thereby producing photocurrent therein. In the improved phototransistor device, a higher photocurrent level is obtained in accordance with the amplification thereof even if the incident light is very small in its power.

8 Claims, 3 Drawing Sheets

PHOTOTRANSISTOR DEVICE

FIELD OF THE INVENTION

The invention relates to a phototransistor device, and more particularly to a phototransistor device in which a high speed response has obtained even if an incident light thereto is very small in its power.

BACKGROUND OF THE INVENTION

One conventional optical bistable device is described on pages 13 to 15 of "Applied Physics Letters 45(1), 1 July 1984". The optical bistable device is called a self-electro-optic effect device (simply called "SEED" hereinafter) and comprises a multiple quantum well between two intrinsic regions, and p- and n-semiconductor layers provided respectively outside the two intrinsic regions.

In operation, a reverse-biased voltage is applied across the SEED from a power source having a series resistance while a predetermined power of incident light is input thereto whereby the light is absorbed in the multiple quantum well so that photocurrent is induced therein. The incident light wavelength is chosen to be a wavelength at which the exciton resonance peak is produced at nearly zero biased voltage applied across the SEED. Where the power of the incident light is increased, the photocurrent increases, thereby reducing the reverse-biased voltage applied thereacross due to the voltage drop by the series resistance. The thus reduced voltage shifts the exciton resonance peak in the direction of shorter wavelength to result in a further increase of the photocurrent.

Finally, the reverse biased voltage is dropped nearly down to zero so that much of the absorption of the incident light is due to the exciton resonance peak. For this reason, an optical bistability is obtained in the SEED by increasing and decreasing the incident light power. The phenomenon mentioned here will be described in detail later.

In the conventional SEED, however, if the power of the incident light is very small, the induced photocurrent is correspondingly small so that the voltage drop across the series resistance of the power source is very small. For this reason, it is difficult to drop the voltage applied across the SEED nearly down to zero.

If the series resistance is made to be bigger in its value, for the purpose of decreasing the biased voltage nearly down to zero, the response speed becomes lower due to the increase of time constant CR.

SUMMARY OF THE INVENTION

Accordingly, it is an object of the invention to provide a phototransistor device in which a high speed response is obtained even if the power of incident light is very small.

It is a further object of the invention to provide a phototransistor device in which an optical bistability is obtained with a simple construction thereof.

According to the invention, there is provided a phototransistor device comprising a multiple quantum well, one conduction type of a collector region and another conduction type of a base region respectively provided on the opposite sides of said multiple quantum well, and one conduction type of an emitter region provided on one side of said base region, said one side being an opposite side to the side on which said multiple quantum well is positioned.

BRIEF DESCRIPTION OF THE DRAWINGS

The invention will be explained in more detail in accordance with the following drawings wherein.

DESCRIPTION OF THE PREFERRED EMBODIMENT

Figure 1:
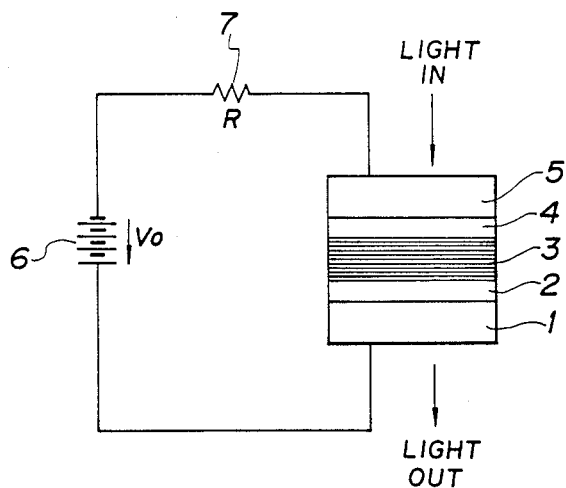
FIG. 1 is a cross sectional view illustrating the conventional SEED.

Before explaining an embodiment according to the invention, the SEED as briefly mentioned before will be explained in more detail. In FIG. 1, there is shown the SEED comprising an n-semiconductor layer 1, an intrinsic semiconductor layer 2, an intrinsic multiple quantum well 3, an intrinsic semiconductor layer 4, and a p-semiconductor layer 5. In addition, there is provided a power source circuit comprising a power source 6 having a reverse-biased voltage Vo and a series resistance 7.

Figure 2:
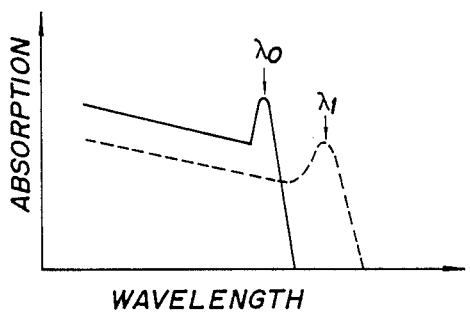
FIG. 2 is a diagram explaining a relation between an incident light wavelength and light absorption in an optical bistable element.

FIG. 2 shows an exciton resonance peak to be observed at a room temperature in the intrinsic multiple quantum well 3. The solid line having the peak at the wavelength $\lambda_o$ is a characteristic curve for an electric field being nearly zero to be produced by a reverse-biased voltage of the power source 6 while the dotted line having the peak at the wavelength $\lambda_1$ is another curve for a predetermined level of electric field to be produced by the power source 6. This means that decreasing a reverse-biased voltage applied across the SEED results in the shift of the exciton resonance peak wavelength of an incident light in the direction of a shorter wavelength.

Figure 3:
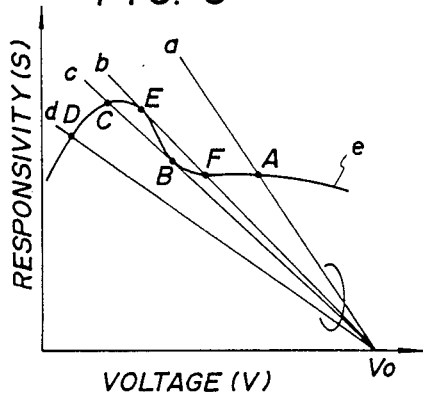
FIG. 3 is a diagram showing a relation between a voltage applied across the optical bistable element and photoresponsivity thereof.

FIG. 3 shows a photoresponsivity S of the SEED in regard to a voltage V applied thereto. The photoresponsivity S is represented by the following equation.

$$I = SI_o = \frac{V_o - V}{R}$$

where I is the value of photocurrent in the SEED, $I_o$ is an incident light power to be input thereto, R is the value of the resistance 7, $V_o$ is the power source voltage, and V is a voltage to be applied across the intrinsic multiple quantum well 3 therein. In FIG. 3, straight lines a, b, c and d are load resistance lines the inclination of which depends upon the value $V/RI_o$ and the intersection of which is at the reverse-biased value $V_o$ with the voltage axis V while a curve e is a photo-responsivity curve intersecting at points A, B, C, D and E with the load resistance lines a, b, c and d. In regard to a load resistance line, increasing the incident light power $I_o$ decreases the degree in the inclination thereof as shown by the load resistance lines a to d. On the other hand, the photoresponsivity curve e represents a peak at a specific reverse-biased voltage at which the exciton resonance peak of the incident light absorption shifts in the direction of longer wavelength in accordance with the increase of the reverse-biased voltage.

In operation, increasing the incident light power $I_o$ at the wavelength $\lambda_o$, in other words, decreasing the reverse-biased voltage V applied across the multiple quantum well 3 due to the increase of the photocurrent therein, results in the shift of operating points from the intersecting point A to the intersecting point B, further from the intersecting point B to the intersecting point C along the line c, finally from the intersecting point C to the intersecting point D. On the contrary, decreasing the incident light power $I_o$ at the same wavelength as mentioned above results in the shift of the operating points from D to C, further from C to E, still further from E to F along the line b, finally from F to A.

Figure 4:
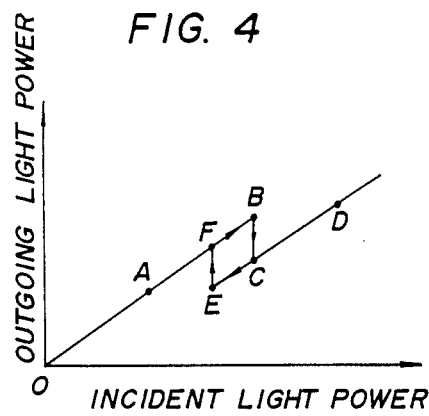
FIG. 4 is a diagram showing input and output light powers in the optical bistable element.

The phenomenon of shifting the operating points as described here is shown in FIG. 4 in a relation of outgoing light power in regard to the incident light power $I_o$. In FIG. 4, the shift from the operating point B to the operating point C corresponds to switching ON in the SEED while the shift from the operating point E to the operating point F corresponds to switching OFF therein so that an optically bistable switching operation is obtained in the SEED.

Figure 5:
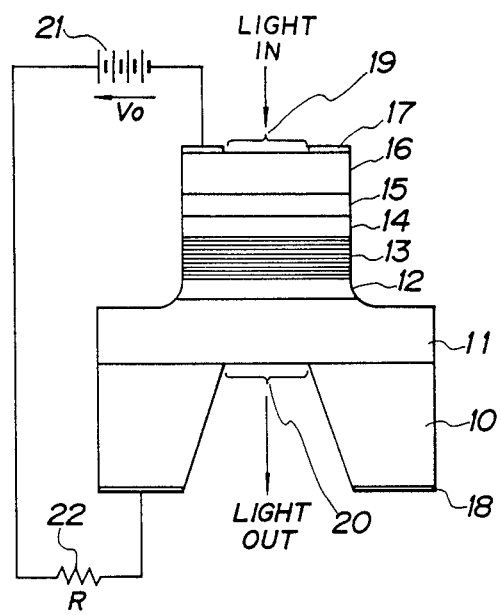
FIG. 5 is a cross sectional view illustrating a phototransistor device in the first embodiment according to the invention.

In FIG. 5, there is shown a phototransistor device in the first embodiment according to the invention which comprises a substrate 10 of n-GaAs, a collector region 11 of n-$Al_{x_o}Ga_{1-x_c}As$, an intrinsic layer 12 of i-AlGaAs, an intrinsic multiple quantum well 13 including well layer of $Al_{x_w}Ga_{1-x_w}As$ and barrier layer of $Al_{x_{br}}Ga_{1-x_{br}}As$, an intrinsic layer 14 of i-AlGaAs, a base region 15 of p-$Al_{x_b}Ga_{1-x_b}As$, an emitter region 16 of n-$Al_{x_e}Ga_{1-x_e}As$, an emitter electrode 17, a collector electrode 18, an aperture 19 for incident light, and an aperture 20 for outgoing light. The phototransistor device further comprises a power source 21 of a predetermined D.C. voltage $V_o$ and a series resistance 22 of a predetermined value R. In the phototransistor device, the $X_c$ of the collector region 11 is larger than zero, typically 0.2 to 0.4 and the thickness thereof is more than 0.1 μm, typically 2 μm. The composition of the i-AlGaAs layer 12 is less than the value $X_c$, typically 0.2 to 0.4 and the thickness thereof is more than 50 Å, typically 500 to 1000 Å. The $X_w$ of the well layer is zero to 1, typically zero and the thickness of the well layer is less than 300 Å, typically less than 100 Å. The $X_{br}$ of the barrier layer is zero to 1 ($1 \geq X_{br} > X_w \geq 0$), typically 0.2 to 0.4. The thickness of the barrier layer is more than 20 Å, typically less than 100 Å and the total thickness of the well and barrier layers is more than 1000 Å, typically 0.5 to 1 μm. The $X_b$ of the base region 15 is more than the value $X_w$, typically 0.2 to 0.4 and the base thickness is less than the length of electron diffusion length, typically 500 to 2000 Å. The the $X_e$ of the emitter region 16 is more than the value $X_b$, typically 0.2 to 0.6, and the emitter thickness is more than 0.2 μm, typically 0.5 to 1.5 μm.

In operation, a reverse-biased voltage $V_o$ is applied through the resistance 22 from the power source 21 across the i-multiple quantum well 13 while a predetermined power $I_o$ of the incident light is input through the aperture 19. The incident light wavelength is chosen to be a wavelength at which the exciton resonance peak is produced at nearly zero biased voltage V to be applied across the i-multiple quantum well 13. Photocurrent is induced therein and results in a voltage drop in accordance with the current flowing through the resistance 22 so that the reverse-biased voltage V applied across the i-multiple quantum well 13 is decreased, thereby resulting in a shift of the exciton resonance peak in the direction of shorter wavelength. Increasing the incident light power $I_o$ results in the increase of the photocurrent therein so that the reverse-biased voltage V is much decreased, finally down to nearly zero. In such a situation, a wavelength at which the exciton resonance peak is produced becomes equal to the wavelength $\lambda_o$ of the incident light so that the switching ON is performed in the phototransistor device.

Figure 6A:
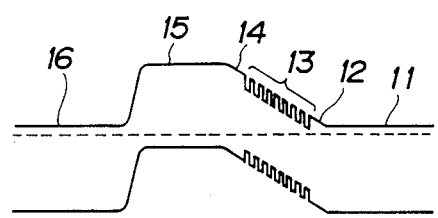
FIGS. 6A and 6B are diagrams showing energy bands in cases where thermal equilibrium is obtained and where a reverse-biased voltage is applied across the phototransistor respectively in the first embodiment according to the invention.
Figure 6B:
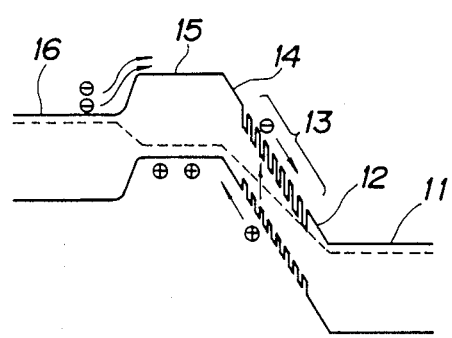

In the phototransistor device, especially, the incident light is input through the aperture 19 to be partially absorbed in the i-multiple quantum well 13 so that pairs of electrons and holes are produced therein. The electrons are injected into the collector region 11 while the holes are injected into the base region 15. In the injection of the hole into the base region 15, electrons of $\beta$ in number are injected from the emitter region 16 to the base region 15 in regard to the injection of one hole into the base region 15. The $\beta$ is a common emitter current gain which is more than 1 ($\beta > 1$), usually 50 to 1000. Therefore, in a case where one photon is absorbed in the i-multiple quantum well 13, $\beta$ electrons are flowed therethrough. The phenomenon mentioned here is illustrated by the energy band diagram in FIG. 6B while FIG. 6A shows the energy band under which thermal equilibrium is maintained. In FIGS. 6A and 6B, like reference numerals indicate like parts in FIG. 5.

As clearly understood from the embodiment according to the invention mentioned above, even if the incident light power $I_o$ is very small, the photocurrent thereby induced flows with a much higher level so that the sufficient voltage drop is obtained by the series resistance to result in an efficient feedback effect without the necessity of a larger series resistance in its value. As a result, a higher response rate is obtained even by a small incident light power in the phototransistor device according to the invention. In other words, the photoresponsivity that results as much as 10 to 100 times greater than the conventional SEED.

A phototransistor device in the first embodiment according to the invention is fabricated in following procedures. First of all, a collector region 11, an i-AlGaAs layer 12, an i-multiple quantum well 13, an i-AlGaAs layer 14, a base region 15, and an emitter region 16 are formed in turn on an n-GaAs substrate 10 in a crystal growth, Next, an emitter electrode 17 and a collector electrode 18 are formed on the outer surfaces of the emitter region 16 and the n-GaAs substrate 10 respectively. Finally, an aperture 19 for incident light and an aperture 20 for outgoing light are formed in the electrodes 17 and 18 by, respectively, an etching process.

Figure 7:
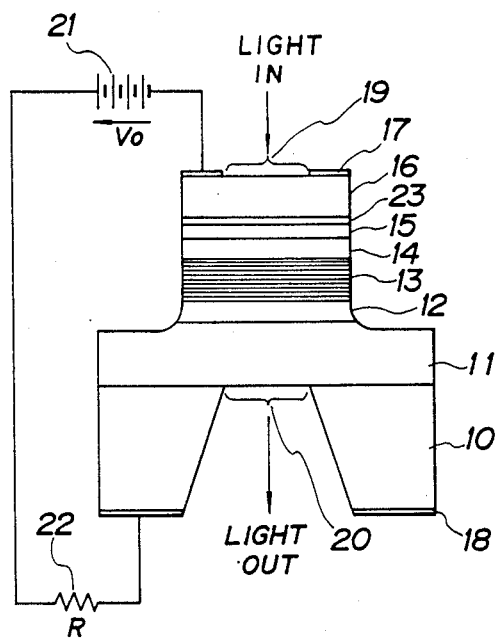
FIG. 7 is a cross sectional view illustrating a phototransistor device in the second embodiment according to the invention.

In FIG. 7, there is shown a phototransistor device in the second embodiment according to the invention which further comprises an additional emitter region 23 between an emitter 16 and a base region 15 originally provided in a phototransistor in the first embodiment according to the invention. In the construction thereof, the thickness of the base region 15 is almost the same as the mean free path of electron, for instance, less than 300 Å, typically 50 to 100 Å so that the time of electron to pass through the base region 15 can be very short. In addition, the additionally provided emitter region 23 is of n-$AX_{e'}Ga_{1-x_{e'}}As$ ($Xe' \geq Xb$, typically $Xe'=Xe=0.2$ to 0.6), the electron density thereof is lower ($n \leq 1 \times 10^{18} cm^{-3}$), and the thickness thereof is more than 1000 Å, typically 0.5 to 1 μm. In such a construction, a barrier is composed of the additional emitter region 23 and the base region 15.

Figure 8A:
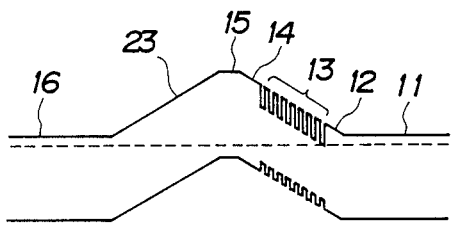
FIGS. 8A and 8B are diagrams corresponding to FIGS. 6A and 6B whereby the second embodiment according to the invention is explained therein.
Figure 8B:
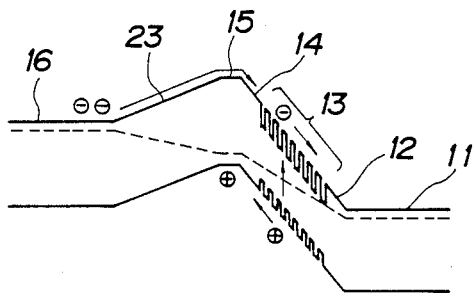

In operation, the optical bistability is obtained in a higher response rate than the first embodiment according to the invention for the reason why it can be faster for electron to pass through the base region 15. FIGS. 8A and 8B illustrate energy bands which correspond to FIGS. 6A and 6B respectively.

Although the invention has been described with respect to specific embodiments for complete and clear disclosure, the appended claims are not to thus limited but are to be construed as embodying all modification and alternative constructions that may occur to one skilled in the art which fairly fall within the basic teaching herein set forth.

For instance, (1) Although an npn transistor was used in the first and second embodiments, a pnp transistor may be adopted.

(2) An i-multiple quantum well may be replaced by an n- or p-multiple quantum well if the carrier density thereof is low in such an extent that the n- or p-multiple quantum well is made to be depletion.

(3) The respective i-AlGaAs layers to be provided on both sides of an i-multiple quantum well may be dispensable if such an i-multiple quantum well can be formed without any diffusion from the outside thereof. This is because the i-AlGaAs layers are provided to avoid the diffusion of dopants thereinto.

(4) A multiple quantum well or supperlattice may be formed as a buffer layer before forming a collector region.

(5) Although a base region is floated without a base electrode in the first and second embodiments, such a base electrode may be provided to apply a biased voltage to the base region so as to result in the optical biastability.

(6) Although energy band gap of an additional emitter region 23 and the base region 15 are identical to one another in FIGS. 8A and 8B, an energy band gap of the additional emitter region 23 may be wider than that of the base region 15.

(7) Although an emitter electrode is provided directly on an emitter region, a cap layer may be provided therebetween to result in an ohmic electrode.

(8) Although AlGaAs/GaAs system is used in the first and second embodiments, such materials as InGaAlAs/InP system, InGaAsP/InP system etc. may be adopted.

What is claimed is:

1. A phototransistor device comprising:
   a multiple quantum well having at least two opposite sides,
   a collector region of a first conduction type and a base region of a second conduction type, each of said base and collector regions being provided on a respective one of said two opposite sides of said multiple quantum well, and
   a first emitter region of said first conduction type, said first emitter region being provided on one side of said base region, said one side being an opposite side to the side on which said multiple quantum well is positioned,
   said emitter, base and collector regions constituting those only of a phototransistor, and no other transistor structure being provided in the direction of incident light.

2. A phototransistor device according to claim 1, wherein said first emitter region is provided thereon with an emitter electrode having an aperture for passing therethrough incident light, and said collector region is provided thereon with a collector electrode having an aperture for passing therethrough outgoing light.

3. A phototransistor device according to claim 1, further comprising a second emitter region provided between said first emitter region and said base region, said second emitter region having a lower electron density than said first emitter region, and the thickness of said second emitter region being approximately the same dimension as the mean free path of electrons.

4. A phototransistor device according to claims 1, 2 or 3,
   further comprising a power source and a series resistance connected in a circuit with said multiple quantum well whereby a reverse-biased voltage is applied across said multiple quantum well.

5. A phototransistor device, having a light input portion a light output portion and multiple planar layers therebetween, comprising:
   a multiple quantum well (MQW) layer, said MQW layer having two opposite planar sides oriented toward said light input portion and said light output portion, respectively;
   a collector region of a first conduction type forming a layer disposed on the planar side of said MQW layer oriented toward said light output portion;
   a base region of a second conduction type forming a layer disposed on the planar side of said MQW layer oriented toward said light input portion, and
   a first emitter region of said first conduction type forming a layer on the planar side of said MQW layer oriented toward said light input portion, said layer being dispersed between said base region and said light input portion.

6. The phototransistor device of claim 5 wherein said base region absorbs light at a wavelength $\lambda_1$ and passes light at a wavelength $\lambda_0$.

7. The phototransistor device of claim 5 wherein said base region comprises a semiconductor material having a coefficient $X_b$ and said MQW layer comprises a semiconductor material having a coefficient $X_w$ where $X_b > X_w$.

8. The phototransistor device of claim 7 wherein $x_b$ has a value in the range 0.2 to 0.4.

* * * * *